US006989202B2

(12) United States Patent
Asai et al.

(10) Patent No.: US 6,989,202 B2
(45) Date of Patent: Jan. 24, 2006

(54) METHOD FOR FABRICATING A III NITRIDE FILM, AN UNDERLAYER FOR FABRICATING A III NITRIDE FILM AND A METHOD FOR FABRICATING THE SAME UNDERLAYER

(75) Inventors: Keiichiro Asai, Nagoya (JP);
Tomohiko Shibata, Kasugai (JP);
Yukinori Nakamura, Nagoya (JP);
Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/891,340

(22) Filed: Jul. 14, 2004

(65) Prior Publication Data

US 2004/0247947 A1 Dec. 9, 2004

Related U.S. Application Data

(60) Continuation of application No. 10/456,418, filed on Jun. 6, 2003, now abandoned, which is a division of application No. 10/044,778, filed on Nov. 7, 2001, now Pat. No. 6,649,493.

(30) Foreign Application Priority Data

Nov. 21, 2000 (JP) .............................. 2000-353941
Oct. 12, 2001 (JP) .............................. 2001-314662

(51) Int. Cl.
*B32B 9/00* (2006.01)
(52) U.S. Cl. ........................ 428/698; 428/697; 428/699
(58) Field of Classification Search ................ 428/697, 428/699, 698
See application file for complete search history.

(56) References Cited

U.S. PATENT DOCUMENTS

| 5,290,393 | A  | * | 3/1994 | Nakamura | .................... 117/89 |
| 6,051,849 | A  |   | 4/2000 | Davis et al. | |
| 6,091,083 | A  |   | 7/2000 | Hata et al. | |
| 6,156,581 | A  |   | 12/2000 | Vaudo et al. | |
| 6,177,688 | B1 |   | 1/2001 | Linthicum et al. | |
| 6,239,005 | B1 |   | 5/2001 | Sumiya et al. | |
| 6,255,004 | B1 | * | 7/2001 | Yoshida | ...................... 428/698 |
| 6,255,198 | B1 |   | 7/2001 | Linthicum et al. | |
| 6,270,569 | B1 | * | 8/2001 | Shibata et al. | ................. 117/68 |
| 6,291,318 | B1 |   | 9/2001 | Webb et al. | |
| 6,348,096 | B1 |   | 2/2002 | Sunakawa et al. | |
| 6,406,931 | B1 |   | 6/2002 | Han et al. | |
| 6,440,823 | B1 |   | 8/2002 | Vaudo et al. | |
| 6,531,719 | B2 |   | 3/2003 | Shibata et al. | |
| 6,534,791 | B1 |   | 3/2003 | Hayashi et al. | |

(Continued)

FOREIGN PATENT DOCUMENTS

JP                09219540              8/1997

(Continued)

*Primary Examiner*—Archene Turner
(74) *Attorney, Agent, or Firm*—Burr & Brown

(57) ABSTRACT

A method for fabricating a Group III nitride film is provided, including the steps of preparing a substrate, forming an underfilm and then forming the Group III nitride film on the underfilm. The underfilm is a Group III nitride including at least 50 atomic percent of elemental Al for each of the Group III elements of the underfilm Group III nitride. The surface of the underfilm includes a contoured portion and a flat region, and less than 50% of the surface is occupied by the flat region.

5 Claims, 3 Drawing Sheets

U.S. PATENT DOCUMENTS

| | | |
|---|---|---|
| 6,608,327 B1 | 8/2003 | Davis et al. |
| 6,649,493 B2 * | 11/2003 | Asai et al. ........... 257/E21.125 |
| 6,656,269 B2 * | 12/2003 | Tomioka ...................... 117/89 |
| 6,673,149 B1 | 1/2004 | Solomon et al. |
| 2002/0190275 A1 | 12/2002 | Shibata et al. |

FOREIGN PATENT DOCUMENTS

| | | |
|---|---|---|
| JP | 10125608 | 5/1998 |
| JP | 11354846 | 12/1999 |
| JP | 2001168045 | 6/2001 |

* cited by examiner

METHOD FOR FABRICATING A III NITRIDE FILM, AN UNDERLAYER FOR FABRICATING A III NITRIDE FILM AND A METHOD FOR FABRICATING THE SAME UNDERLAYER

CROSS REFERENCE TO RELATED APPLICATION

This application is a continuation of U.S. application Ser. No. 10/456,418, filed Jun. 6, 2003, now abandoned, which is a division of U.S. application Ser. No. 10/044,778, filed Nov. 7, 2001, now U.S. Pat. No. 6,649,493, the entireties of which are incorporated herein by reference.

BACKGROUND OF THE INVENTION (1) Field of the Invention

This invention relates to a method for fabricating a Group III nitride film, an underlayer for fabricating a Group III nitride film and a method for fabricating the same underlayer, particularly usable for semiconductor films constituting a light-emitting diode or a high velocity IC chip.

(2) Related Art Statement

Group III nitride films are employed as semiconductor films constituting light-emitting diodes, and recently, have received much attention as semiconductor films constituting high velocity IC chips for use in cellular phones.

Such Group III nitride films are usually fabricated by MOCVD methods. Concretely, a substrate on which Group III nitride films are formed is set onto a susceptor installed in a given reactor and then heated to 1000° C. or over with a heater provided in or out of the susceptor. Thereafter, raw material gases are introduced with a carrier gas into the reactor and supplied onto the substrate.

On the substrate, the raw material gases are dissolved through thermochemical reaction into constituent elements, which are reacted to deposit and fabricate a desired Group III nitride film on the substrate.

There are few suitable substrates which have lattice constants and thermal expansion coefficients nearly equal to those of Group III nitride films. In this case, the difference in the lattice constants between the Group III nitride film and the substrate may induce more misfit dislocations at the boundary between the Group III nitride film and the substrate. In order to reduce such misfit dislocations, generally, a lower crystallinity buffer layer, which is fabricated at a lower temperature, is provided between the substrate and the Group III nitride film. In this case, the difference in lattice constant is compensated, and thus, many misfit dislocations are not created.

However, the misfit dislocations are not reduced sufficiently even though the buffer layer is provided, so that many dislocations of about $10^9$–$10^{10}$/cm$^2$ may be created in the Group III nitride film, originating from the propagation of the misfit dislocations. As a result, the crystal quality of the Group III nitride film is degraded, and thus, the electrical and optical properties of the Group III nitride film are degraded.

In order to solve the above problem, attempts have been made to form a patterned mask made of $SiO_2$ on the substrate and epitaxially grow the Group III nitride film laterally on the substrate. In this case, misfit dislocations are propagated laterally on the mask, and not propagated vertically. Therefore, the dislocation density of the Group III nitride film can be lowered in the region above the patterned mask.

However, since photolithography processes including etching steps are required in forming patterned masks, the total number of steps in the fabricating process for the Group III nitride film is increased and complicated.

SUMMARY OF THE INVENTION

It is an object of the present invention to provide a method able to easily fabricate a Group III nitride film having a lower dislocation density.

In order to achieve the above object, this invention relates to a method for fabricating a Group III nitride film, including the steps of preparing a given substrate, forming an underfilm with a concave-convex (i.e., a rough contoured) surface structure, in which 50% or below of the surface structure is occupied by a flat region. The underfilm is made of a first Group III nitride including 50 atomic percentage or over of elemental Al with respect to all of the Group III elements constituting the first Group III nitride, and another Group III nitride film is formed on the underfilm.

The inventors intensely worked to obtain a Group III nitride film having lower dislocation density using an easy fabricating process without a patterned mask made of $SiO_2$. As a result, they found out that when the underfilm mentioned above is formed on a substrate and a given Group III nitride film is formed on the underfilm by a MOCVD method, the dislocation density of the Group III nitride film is reduced.

Such an underfilm can be made as follows. First of all, a Group V raw material gas and a Group III raw material gas are supplied onto a substrate at a flow ratio (Group V raw material gas/Group III raw material gas) of 600 or below, to form, on the substrate, a first film made of a Group III nitride including 50 atomic percentages or over of elemental Al for all of the Group III elements through the epitaxial growth for a given period. Then, the Group V raw material gas and the Group III material gas are supplied onto the substrate at flow ratio (Group V raw material gas/Group III raw material gas) of more than 600, to form, on the first film, a second film made of another Group III nitride including 50 atomic percentages or over of elemental Al with respect to all of the Group III elements through the epitaxial growth for a given period.

Moreover, a Group V raw material gas and a Group III raw material gas are supplied onto the substrate under a pressure of 20 Torr or below, to form, on the substrate, a first film made of a Group III nitride including 50 atomic percentage or over of elemental Al with respect to all of the Group III element through epitaxial growth for a given period. Then, the Group V raw material gas and the Group III material gas are supplied onto the substrate under a pressure of more than 20 Torr, to form, on the first film, a second film made of another Group III nitride including 50 atomic percentage or over of elemental Al with respect to all of the Group III elements through epitaxial growth for a given period.

Furthermore, a Group V raw material gas and a Group III raw material gas are supplied onto the substrate heated at 1100° C. or over, to form, on the substrate, a first film made of a Group III nitride including 50 atomic percentage or over of elemental Al with respect to all of the Group III elements through epitaxial growth for a given period. Then, the Group V raw material gas and the Group III material gas are supplied onto the substrate heated at a temperature less than 1100° C., to form, on the first film, a second film made of another Group III nitride including 50 atomic percentage or over of elemental Al with respect to all of the Group III elements through epitaxial growth for a given period.

That is, the above-mentioned underfilm is stepwisely formed using two respective MOCVD fabricating conditions. In this case, the desired crystallinity of the underfilm is developed and a concave-convex structure is formed on the underfilm. If 50 atomic percentage or over of elemental Al with respect to all of the Group III elements is incorporated into the underfilm, the concave-convex contoured structure can be easily formed. Therefore, without using a complicated photolithography process, the underfilm can be easily formed in the same apparatus as that of the Group III nitride film.

Therefore, the Group III nitride film having lower dislocation density and good crystallinity can be fabricated without complicating the fabricating process.

Herein, the first through the third fabricating methods may be employed in isolation or in a combination of two or more. Moreover, another fabricating method may be employed. For example, if the flow ratio of (Group V raw material gas/Group III raw material gas) is set to 1000 or over, the underfilm can be formed in one step by using a single MOCVD fabricating condition.

BRIEF DESCRIPTION OF THE DRAWINGS

For better understanding of the present invention, reference is made to the attached drawings, wherein.

DETAILED DESCRIPTION OF THE INVENTION

Figure 1:
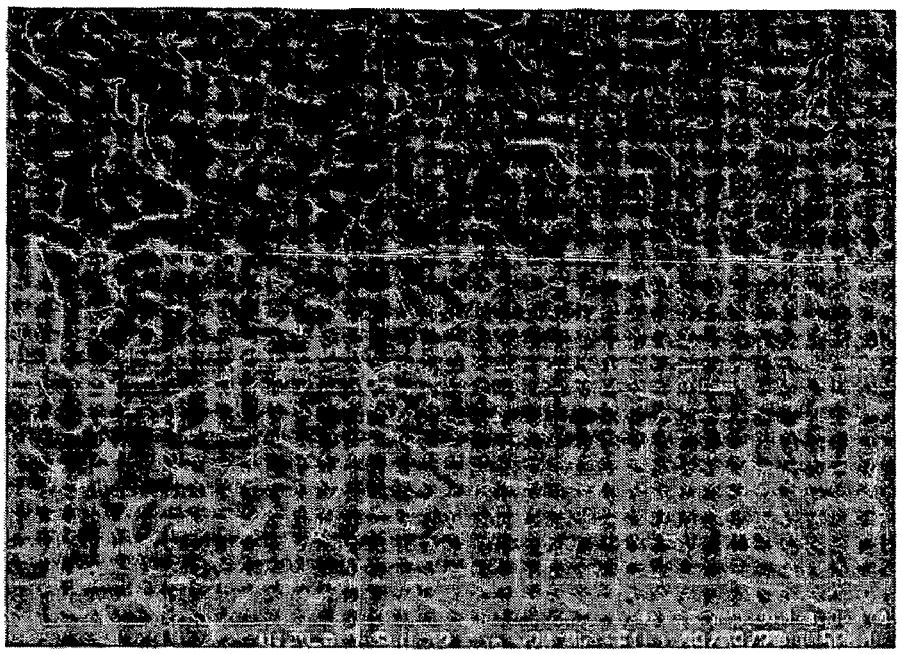
FIG. 1 is a SEM photograph showing the surface configuration of an AlN underfilm fabricated according to the present invention.

This invention will be hereinafter described in detail.

In the fabricating method of a Group III nitride film according to the present invention, it is required that a first Group III nitride to constitute an underfilm includes 50 atomic percentage or over, preferably 70 atomic percentage or over, of elemental Al with respect to all of the Group III elements of the first Group III nitride. Particularly, the first Group III nitride is preferably made of AlN. In this case, the dislocation density of the Group III nitride film to be formed on the underfilm can be reduced effectively, and thus, the crystal quality of the Group III nitride film can be enhanced.

The first Group III nitride may include an additive element such as Ge, Si, Mg, Zn, Be, P or B as occasion demands. Moreover, the first Group III nitride may include minute impurities contained in the raw material gases and the reactor or resulting from the forming conditions.

Moreover, it is required that the flat regions of the surface of the underfilm are set to 50% or below, preferably 10% or below. Herein, the wording "flat region" means a portion of the underfilm surface having an average roughness Ra of 10 Å or below. Particularly, it is desired that no flat regions are formed on the surface of the underfilm, and thus, a concave-convex (rough contoured) structure is formed over the entire surface of the underfilm. In this case, the dislocation density of the Group III nitride film formed on the underfilm can be effectively reduced.

From the same reason as mentioned above, it is desired that the concave-convex structure, except the flat region, includes {101} facets.

As a result, the dislocation density of the Group III nitride film is reduced and thus improved to about $10^6$–$10^7$, which is order of $1/10^2$–$1/10^3$ as compared with a conventional Group III nitride film.

The underfilm may be fabricated by two fabricating steps as follows.

First of all, a Group V raw material gas and a Group III raw material gas containing the constituent elements of the first Group III nitride of the underfilm are introduced into a reactor so that the flow ratio of (Group V raw material gas/Group III raw material gas) is set to 600 or below, preferably 450 or below and the pressure inside the reactor is set to 20 Torr or below, preferably 15 Torr or below, and then, supplied onto a substrate heated at 1100° C. or over, preferably 1150° C. or over, to form a first film made of a Group III nitride including 50 atomic percentage or over of elemental Al with respect to all of the Group III elements through epitaxial growth for a given period.

Herein, it is not necessary that each of the flow rate, pressure and substrate temperature conditions are satisfied, but it is necessary that at least one of these conditions is satisfied.

Thereafter, when the above-mentioned pressure condition and the above-mentioned substrate temperature condition are satisfied, the flow ratio of (Group V raw material gas/Group III raw material gas) is set to 600 or over, preferably 1000 or over, to form, on the first Group III nitride film, a second film made of another Group III nitride including 50 atomic percentage or over of elemental Al with respect to all of the Group III elements. In this way, a concave-convex contoured structure is formed in the surface of the thus obtained underfilm made of the first and the second nitride films.

In forming the second Group III nitride film, the pressure condition may be varied instead of the flow ratio condition to form the underfilm having a concave-convex contoured structure. Concretely, when the above-mentioned flow ratio condition and the above-mentioned substrate temperature condition are satisfied, the interior pressure of the reactor is set to 20 Torr or over, preferably 40 Torr or over.

Moreover, in forming the second Group III nitride film, the substrate temperature condition may be varied instead of the flow rate and pressure conditions to form the underfilm having a concave-convex contoured structure. Concretely, when the above-mentioned flow rate and pressure conditions are satisfied, the substrate temperature is set to 1100° C. or over, preferably 900° C. or below, more preferably within a range of 950–1050° C. Herein, the term substrate temperature means a "setting temperature for the substrate."

The upper limit value and lower limit value not specified may be determined appropriately depending upon the composition of the underfilm and the film-forming rate.

The substrate may be made of an oxide single crystal such as a sapphire single crystal, a ZnO single crystal, a LiAlO$_2$ single crystal, a LiGaO$_2$ single crystal, a MgAl$_2$O$_4$ single crystal, a MgO single crystal, a Group IV single crystal, a Group IV—Group IV single crystal such as a Si single crystal or a SiC single crystal, a Group III–V single crystal such as a GaAs single crystal, an AlN single crystal, a GaN single crystal or an AlGaN single crystal, or a boride single crystal such as $ZrB_2$.

Particularly, when the substrate is a sapphire single crystal, it is desired that a surface-nitriding treatment is performed on the main surface of the substrate for the underlayer to be formed. The surface-nitriding treatment is performed as follows. First, the sapphire single crystal substrate is set in a nitrogen-including atmosphere, such as an ammonia atmosphere, and then heated for a given period. The thickness of the resulting surface nitride layer can be adjusted by appropriately controlling the nitrogen concentration, the nitriding temperature and the nitriding period.

If the sapphire single crystal substrate having the surface nitriding layer thereon is employed, the crystal quality of the underlayer formed directly on the main surface can be improved. As a result, the crystal quality of the Group III nitride film to be formed on the underlayer can be improved, and thus, the dislocation density of the Group III nitride film can be reduced further.

It is desired that the surface-nitriding layer is formed thicker, for example, so that the nitrogen content of the sapphire single crystal substrate at the depth of 1 nm from the main surface is set to five atomic percentages or over, in ESCA analysis.

In view of enhancing the crystal quality of the underfilm, it is desired that the underfilm is formed at a temperature between 1100° C. and 1250° C.

Moreover, an epitaxial substrate composed of a given base material and a high crystallinity surface layer made of a second Group III nitride having a full width at half maximum (FWHM) of 90 seconds or below in X-ray rocking curve may be used.

Using such a substrate as mentioned above and such a fabricating method as according to the present invention, an underfilm that satisfies the conditions required according to the present invention can be fabricated easily and precisely. As a result, the Group III nitride film having lower dislocation density can be easily fabricated with a good yield ratio.

In the present invention, the Group III nitride film formed on the underfilm preferably has a composition of AlxGayInzN (x+y+z=1), and, may include an additive element such as Ge, Si, Mg, Zn, Be, P or B as occasion demands. Moreover, the Group III nitride film may include a minute impurity contained in the raw material gases and the reactor or contained dependent on the forming condition.

EXAMPLES

This invention will be concretely described, hereinafter, by way of example.

Example 1

A C-faced sapphire single crystal substrate was employed, and then, set on a susceptor installed in a reactor of a MOCVD apparatus, and heated to 1200° C. with a heater built in the susceptor.

First, an ammonia gas ($NH_3$) was flown with a hydrogen ($H_2$) carrier gas for five minutes, to nitride the main surface of the substrate. ESCA analysis showed that a surface-nitriding layer was formed on the main surface by the surface-nitriding treatment, and the nitrogen content at a depth of 1 nm from the main surface was seven atomic percentages.

Then, a trimethyl aluminum (TMA), a trimethyl gallium (TMG) and a trimethyl indium (TMI) were employed as an Al raw material, a Ga raw material and an In raw material, respectively. Moreover, an ammonia gas was employed as a nitrogen raw material. These raw material gases were introduced with a $H_2$ carrier gas into the reactor at a flow ratio of $NH_3$/TMA=450 under a pressure of 15 Torr, and supplied onto the substrate, to form an AlN film as a first Group III nitride film through epitaxial growth for 60 minutes. Thereafter, changing the flow ratio to 1000 from 450, another AlN film was formed as a second Group III nitride film, to form an AlN underfilm having a thickness of 1.5 μm.

FIG. 1 is a SEM photograph showing the surface figuration of the AlN underfilm. In FIG. 1, the flat region in the surface of the AlN underfilm is designated by the white region, and the concave-convex structure is designated by the black region. As is apparent from FIG. 1, about 50% of the surface of the AlN film is occupied by the flat region. When the surface roughness of the flat region was observed with a AFM, the results showed that the average roughness Ra of the flat region was 5 Å.

The FWHM in X-ray rocking curve of the (002) plane of the AlN underfilm was 80 seconds.

Then, the substrate was heated at 1050° C. with the heater built in the susceptor, and then, TMG (Ga raw material) and ammonia gas (nitrogen raw material) were introduced with a $H_2$ and $N_2$ carrier gas into the reactor at a flow ratio of $NH_3$/TMG=5000, and supplied onto the substrate, to form a GaN film having a thickness of 3 μm.

The dislocation density of the GaN film was observed to be about $1 \times 10^7/cm^2$ using a transmission electron microscope (TEM).

In forming the second AlN film, if the substrate temperature is changed to 1080° C. from 1200° C. or the raw material pressure inside the reactor is changed to 30 Torr from 15 Torr, instead of changing the flow ratio, such an underfilm having almost 50% flat region ratio can be fabricated, a GaN film having a lower dislocation density of about $1 \times 10^7/cm^2$ can be obtained.

Example 2

A GaN film having a thickness of 3 μm was formed on the AlN underfilm in the same manner as Example 1, except that the TMA and the $NH_3$ were supplied onto a C-faced sapphire crystal substrate heated at 1200° C. at a flow ratio of $NH_3$/TMA=1000 and under a pressure of 15 Torr to form an AlN underfilm having a thickness of 0.7 μm through epitaxial growth for 60 minutes in a single step.

It was confirmed that a concave-convex structure was formed on the surface of the AlN underfilm, as shown in FIG. 1, and the surface roughness (average roughness Ra) of the flat region in the surface of the AlN underfilm was about 5 Å. Also, about 50% of the surface of the AlN film was occupied by the flat region. The FWHM in X-ray rocking curve of the (002) plane of the AlN underfilm was 80 seconds. The dislocation density of the GaN film was about $1 \times 10^7/cm^2$.

Example 3

An AlN underfilm was formed in the same manner as Example 1, except that, in forming the second AlN film, the flow ratio $NH_3$/TMA was changed to 1500 from 1000.

Figure 2:
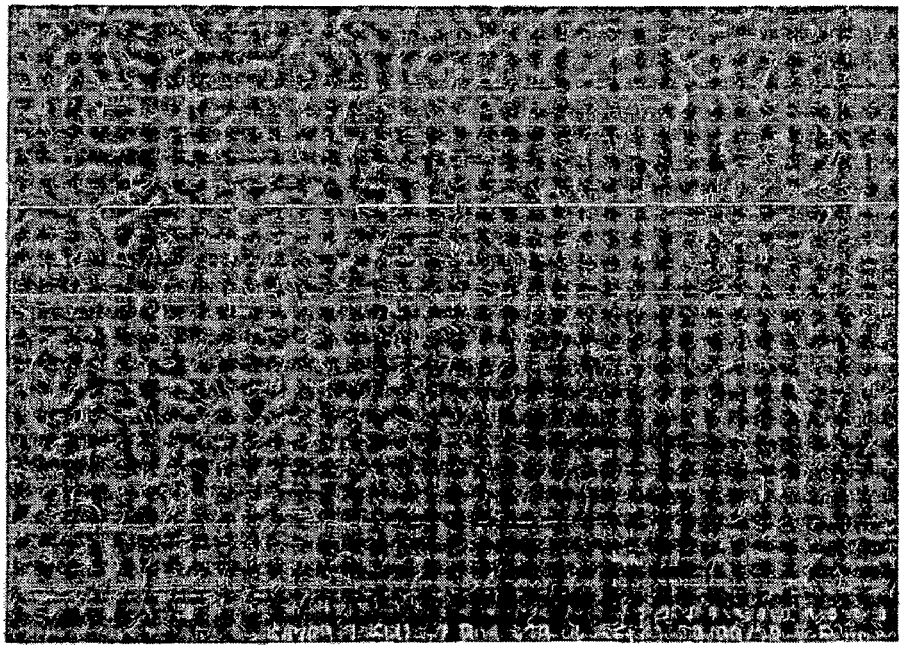
FIG. 2 is a SEM photograph showing the surface configuration of another AlN underfilm fabricated according to the present invention.

FIG. 2 is a SEM photograph showing the surface configuration of the AlN underfilm. As is apparent from FIG. 2, about 20% of the surface of the AlN underfilm was occupied by the flat region. The FWHM in X-ray rocking curve of the (002) plane of the AlN underfilm was 80 seconds.

Then, a GaN film was formed in a thickness of 3 μm on the AlN underfilm in the same manner as Example 1. The dislocation density of the GaN film was found to be about $5\times10^6$/cm$^2$ through TEM observation.

Example 4

An AlN underfilm was formed in the same manner as Example 1, except that, in forming the second AlN film, the flow ratio NH$_3$/TMA was changed to 2000 from 1000.

Figure 3:
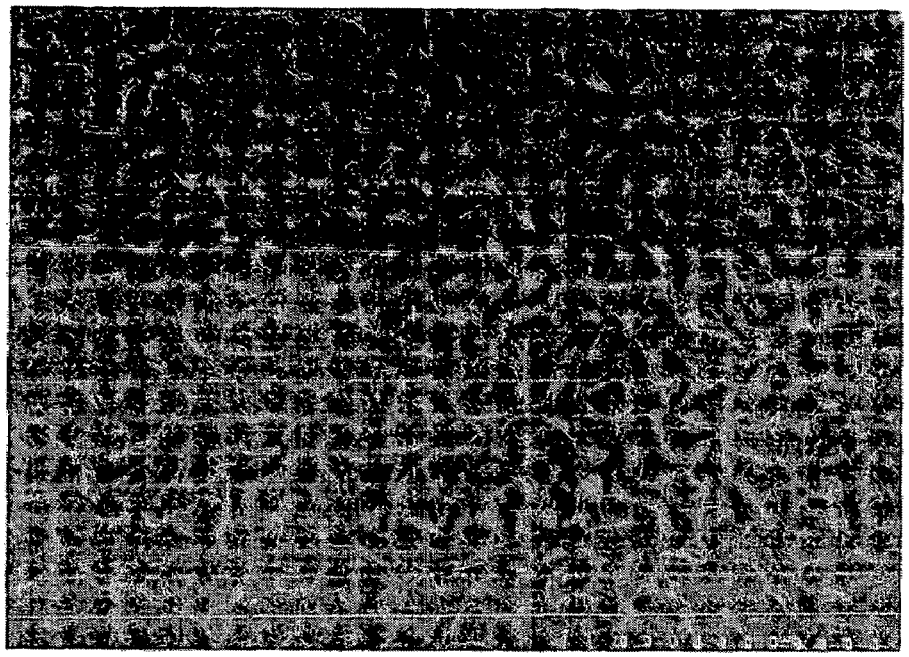
FIG. 3 is a SEM photograph showing the surface configuration of still another AlN underfilm fabricated according to the present invention.

FIG. 3 is a SEM photograph showing the surface configuration of the AlN underfilm. As is apparent from FIG. 3, almost none of the surface of the AlN underfilm was occupied by the flat region, and thus, a concave-convex structure was formed entirely over the AlN underfilm.

Then, a GaN film was formed in a thickness of 3 μm on the AlN underfilm in the same manner as Example 1. The dislocation density of the Ga film was found to be about $1\times10^6$/cm$^2$ through TEM observation.

In forming the second AlN film, if the substrate temperature is changed to 1040° C. from 1200° C. or the raw material pressure inside the reactor is changed to 45 Torr from 15 Torr, instead of changing the flow ratio, an underfilm having the almost 0% flat region ratio can be fabricated and a GaN film having a lower dislocation density of about $1\times10^6$/cm$^2$ can be obtained.

Comparative Example 1

TMA and NH$_3$ were supplied onto a C-faced sapphire substrate heated at 1200° C. at a flow ratio of NH$_3$/TMA=450 under a pressure of 15 Torr, to form an AlN underfilm having a thickness of 1 μm in one step.

Figure 4:
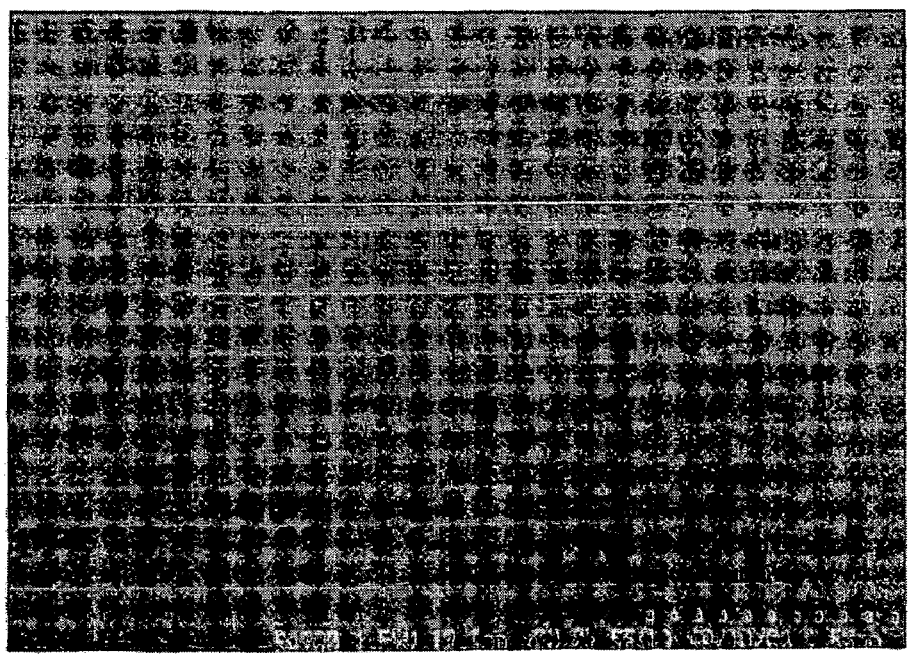
FIG. 4 is a SEM photograph showing the surface configuration of yet another AlN underfilm according to the present invention.

FIG. 4 is a SEM photograph showing the surface configuration of the AlN underfilm. As is apparent from FIG. 4, all of the surface of the AlN underfilm was occupied by the flat region.

Then, a GaN film was formed on the AlN underfilm in the same manner as Examples. The dislocation density of the AlN underfilm was about $1\times110$/cm$^2$.

Comparative Example 2

TMA and NH$_3$ were supplied onto a C-faced sapphire substrate heated at 1200° C. at a flow ratio of NH$_3$/TMA=700 under a pressure of 15 Torr, to form an AlN underfilm having a thickness of 1 μm in one step.

Figure 5:
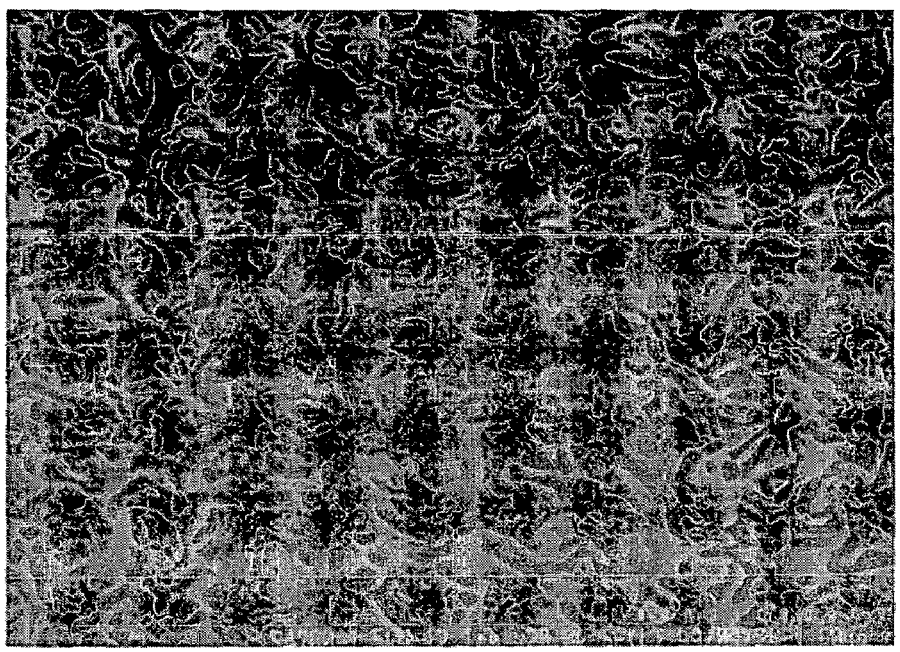
FIG. 5 is a SEM photograph showing the surface configuration of yet another AlN underfilm according to the present invention.

FIG. 5 is a SEM photograph showing the surface figuration of the AlN underfilm. As is apparent from FIG. 5, most of the surface, that is, about 70% of the surface of the AlN underfilm was occupied by the flat region.

Then, a GaN film was formed on the AlN underfilm in the same manner as Examples. The dislocation density of the GaN film was about $8\times10^7$/cm$^2$.

As is apparent from Examples and Comparative Examples, when an AlN underfilm is formed according to the present invention and a GaN film as a Group III nitride film is formed on the AlN underfilm, the dislocation density of the GaN film can be reduced to an order of $10^7$/cm$^2$.

Although the present invention was described in detail with reference to the above examples, this invention is not limited to the above disclosure and every kind of variation and modification may be made without departing from the scope of the present invention.

For example, in forming the second AlN film in Examples, only if the flow ratio NH$_3$/TMA is set within the range required according to the present invention, it may be changed during the formation of the second AlN film constituting the AlN underfilm. Instead of the GaN film, an AlGaInN film or an AlN film may be formed on the AlN underfilm. Moreover, although the AlN underfilm and the GaN film are formed in the same MOCVD apparatus, they may be formed in respective appropriate MOCVD apparatuses.

For developing the crystal qualities of an underfilm made of e.g., AlN and a Group III nitride film made of e.g., GaN, a buffer layer or a multi-layered stacking films constituting, e.g., a distorted superlattice structure may be provided between a substrate and the underfilm or between the underfilm and the Group III nitride film.

As explained above, if an underfilm is formed on a given substrate using a simple MOCVD method according to the present invention and then a desired Group III nitride film is formed on the underfilm, the dislocation density of the Group III nitride film can be remarkably reduced.

We claim:

1. A support for fabricating a Group III nitride film, comprising:
   a sapphire single crystal substrate having a nitrided surface; and
   an underfilm comprising a first Group III nitride including at least 50 atomic percent of elemental Al with respect to all of the Group III elements constituting said first Group III nitride, said underfilm including a contoured surface structure including flat regions, wherein 50% or less of said contoured surface structure is occupied by said flat regions.

2. The support of claim 1, wherein-said first Group III nitride includes at least 70 atomic percent elemental Al with respect to all of the Group III elements constituting the first Group III nitride.

3. The support of claim 2, wherein said first Group III nitride is AlN.

4. The support of claim 1, wherein no more than 10% of said contoured surface structure of said underfilm is occupied by said flat regions.

5. The support of claim 1, wherein said contoured surface structure except said flat regions includes {101} facets.

* * * * *